US 6,559,653 B2

(12) United States Patent
Macke, Sr. et al.

(10) Patent No.: US 6,559,653 B2
(45) Date of Patent: May 6, 2003

(54) THREE WIRE INTERFACE FOR FIELD WIRING OF ON/OFF SENSORS

(75) Inventors: David C. Macke, Sr., Glendale, MO (US); Roger D. Chamberlain, St. Louis, MO (US)

(73) Assignee: Becs Technology, Inc., St. Louis, MO (US)

(*) Notice: Subject to any disclaimer, the term of this patent is extended or adjusted under 35 U.S.C. 154(b) by 0 days.

(21) Appl. No.: 09/361,764

(22) Filed: Jul. 27, 1999

(65) Prior Publication Data

US 2002/0017908 A1 Feb. 14, 2002

(51) Int. Cl.$^7$ .............................................. H01H 31/02
(52) U.S. Cl. ....................................... 324/555; 340/654
(58) Field of Search .................................. 324/555, 522, 324/140 R, 141, 142; 340/660, 658, 640, 652, 654

(56) References Cited

U.S. PATENT DOCUMENTS

| | | | | |
|---|---|---|---|---|
| 4,482,818 A | * | 11/1984 | Ryczek et al. | ............... 307/257 |
| 5,229,653 A | * | 7/1993 | Lamarche | ................... 307/116 |
| 5,488,307 A | | 1/1996 | Plott | ........................... 324/555 |

OTHER PUBLICATIONS

Jimes Lei "High Voltage Off–Line Linear Regulator", 1993.

* cited by examiner

Primary Examiner—Safet Metjahic
Assistant Examiner—Etienne LeRoux
(74) Attorney, Agent, or Firm—Bryan Cave LLP

(57) ABSTRACT

A three-wire sensor interface for field wiring of conventional on/off type control sensors that delivers power to the sensor, provides a normally open control output from the sensor and, concurrently, provides a normally closed control output from the sensor. The sensor interface includes a plurality of external terminals including a normally open external terminal for electrically connecting to zero, one, or more normally open load devices to control the operation of the normally open load device, and a normally closed external terminal for electrically connecting to zero, one, or more normally closed load devices to control the operation of the normally closed load device. A plurality of interface terminals are preferably electrically coupled between the sensor interface and the sensor and include a normally open control terminal and a normally closed control terminal. The sensor interface further includes an interface circuit adapted to receive the control signals from the sensor subsystem through the normally open and normally closed control terminals and to couple these control signals to the appropriate normally open or normally closed external terminals for controlling the external load devices.

24 Claims, 5 Drawing Sheets

THREE WIRE INTERFACE FOR FIELD WIRING OF ON/OFF SENSORS

FIELD OF THE INVENTION

The present invention relates generally to interface devices and methods used to provide power to sensors and to provide normally open and/or normally closed outputs from the sensors to drive external loads.

BACKGROUND OF THE INVENTION

Conventional sensor interface units provide a means for supplying power to a control sensor and for translating the sensor's control outputs to drive external loads. These conventional interface units are typically used with various types of on/off control sensors, proximity detectors, level sensors, and any other devices that take or provide measurements that can be used to control devices or translated into control outputs, such as normally open and/or normally closed control outputs. The interface units are typically configured to control various types of loads such as, for example, starter relays connected to motors, solenoid actuators and programmable logic controllers (PLCs).

One conventional sensor interface unit is a standard two-wire interface, as shown in FIGS. 1a and 1b, that operates in either a normally open or a normally closed configuration (one or the other, but not both). In such a conventional two-wire interface, power for the sensor is provided from the current through the load, which requires a minimum leakage current through the load when the control output is in an inactive or off state. These two-wire interfaces may be designed to operate on AC power, DC power, or configurable to use either AC or DC power. Prototypical interface units of this type are model Bi25-G47SR-FX3X2, available from Turck USA and model NJ2-12GM50-WS, available through Pepperl+Fuchs.

A conventional variation on the standard two-wire interface unit is a field programmable unit that provides the ability to set the active state, i.e., either normally open or normally closed, via a switching mechanism in the field. For example, this may be provided by including a user interface on the sensor or by using additional wiring such as two terminals that are shorted to configure as a normally closed interface and left open to configure as a normally open interface.

Another type of conventional sensor interface unit is a three-wire unit in which power to the sensor is provided separately from the control outputs from the sensor, wherein the power and one of the control functions share a common wire. This type of configuration is illustrated in FIGS. 1c through 1f. FIGS. 1c and 1d show a three-wire normally open (FIG. 1c) and normally closed (FIG. 1d) source interface connected to a load device 110. The source interface 112 is powered through terminals 103 and 105. Switched power (in a source configuration) is available to the load between terminals 103 and 104. For the three-wire normally open source interface 112 shown in FIG. 1c, the load is switched on when the source interface 112 is active and switched off when the source interface 112 is inactive. For the three-wire normally closed source interface 112 shown in FIG. 1d, the load is switched on when the source interface 112 is inactive and switched off when the source interface 112 is active. FIGS. 1e and 1f illustrate a prior art three wire normally open (FIG. 1e) and normally closed (FIG. 1f) sink interface 114. The sink interface 114 is powered through terminals 106 and 108. Switched power (in a sink configuration) is available to the load between terminals 106 and 107. For the three-wire normally open sink interface 114 shown in FIG. 1e, the load is switched on when the sink interface 114 is active and switched off when the sink interface 114 is inactive. For the three-wire normally closed sink interface 114 shown in FIG. 1f, the load is switched on when the sink interface 114 is inactive and switched off when the sink interface 114 is active.

Yet another conventional interface unit includes four wires that is capable of simultaneously providing both normally open and normally closed control outputs. Two of the four wires are used to provide supply power to the sensor, one of the wires provides the normally open control output, and the last wire provides the normally closed control output. The additional fourth wire can be a significant disadvantage in small sensors, where space (especially wiring space) is at a premium.

While these above-mentioned sensor interface units are acceptable in certain applications, a need still remains for a sensor interface capable of simultaneously providing a normally open and a normally closed control output using only three wires. A preferred sensor interface would include a maximum of three external terminals for connection to three wires or conductors including a power terminal and terminals for connecting the sensor interface to load devices, such as a normally open and a normally closed load device. The sensor interface would preferably be adapted to control the normally open and the normally closed load devices concurrently.

SUMMARY OF THE INVENTION

The current invention provides a means for field wiring of conventional on/off type control sensors using a three-wire sensor interface that (i) delivers power to the sensor; (ii) provides a normally open control output from the sensor; and, concurrently, (iii) provides a normally closed control output from the sensor.

In one embodiment, the three-wire sensor interface is capable of being coupled to a sensor subsystem for conducting signals to and from the sensor subsystem. Preferably, the sensor subsystem provides normally open and normally closed control signals and the sensor interface provides interfaces for communicating these signals to control normally open and/or normally closed load devices. The preferred interface unit includes a plurality of external terminals including a normally open external terminal that may be electrically connected to one or more normally open load devices to control the operation of the normally open load devices, and a normally closed external terminal that may be electrically connected to one or more normally closed load devices to control the operation of the normally closed load devices. The interface unit also preferably includes an external power terminal for connection to a source of electrical power for supplying power to the sensor interface and, in one embodiment, to the sensor subsystem. A plurality of interface terminals are preferably electrically coupled between the interface unit and the sensor subsystem and include one or more control terminals, e.g., a normally open control terminal and a normally closed control terminal. The interface unit also includes an interface circuit adapted to receive the normally open and normally closed control signals from the sensor subsystem through the normally open and normally closed control terminals and to couple these control signals to the appropriate normally open or normally closed external terminals for controlling the external load devices.

In another embodiment, the interface circuit includes a normally open control path that receives the normally open control signal from the sensor subsystem and couples the normally open control signal to the normally open external terminal, and a normally closed control path that receives the normally closed control signal from the sensor subsystem and couples this signal to the normally closed external terminal. The interface circuit also receives supply power through the external power terminal from an external power supply. In one embodiment in which both types of load devices (normally open and normally closed) are connected, the circuit couples the supply power to the interface power terminal through the normally open control path when the normally open control signal is inactive or, alternatively, couples the supply power to the interface power terminal through the normally closed control path when the normally closed control signal is inactive. When used in a configuration in which only one type of load device is present, the circuit couples the supply power to the interface power terminal through either the normally open or normally closed control path depending on which type of device is connected to the sensor interface.

BRIEF DESCRIPTION OF THE DRAWINGS

These and other features, aspects, and advantages of the present invention will become better understood with regard to the following description, appended claims, and accompanying drawings wherein:

These drawings are provided for illustrative purposes only and should not be used to unduly limit the scope of the present invention.

DETAILED DESCRIPTION OF THE INVENTION

Figure 1A:
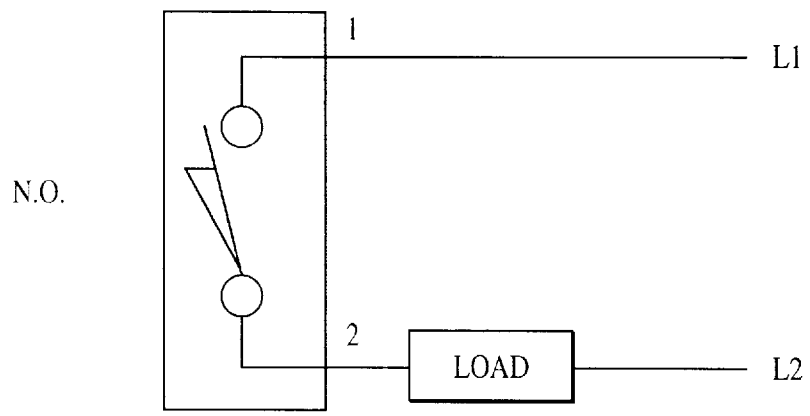
FIG. 1 includes diagrammatic representations of prior art sensor interface designs.
Figure 1B:
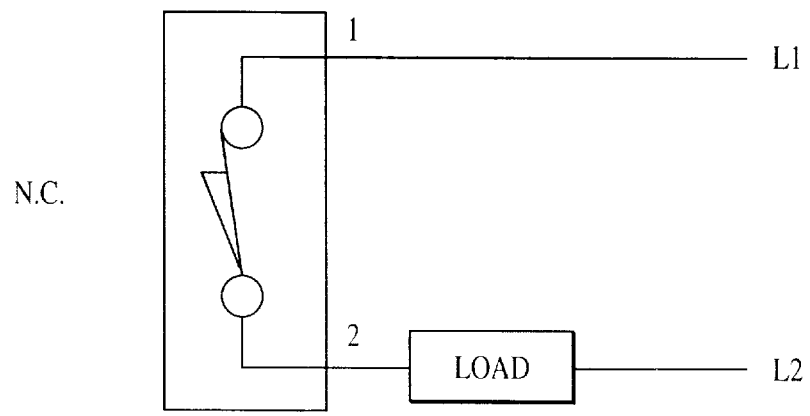
Figure 1C:
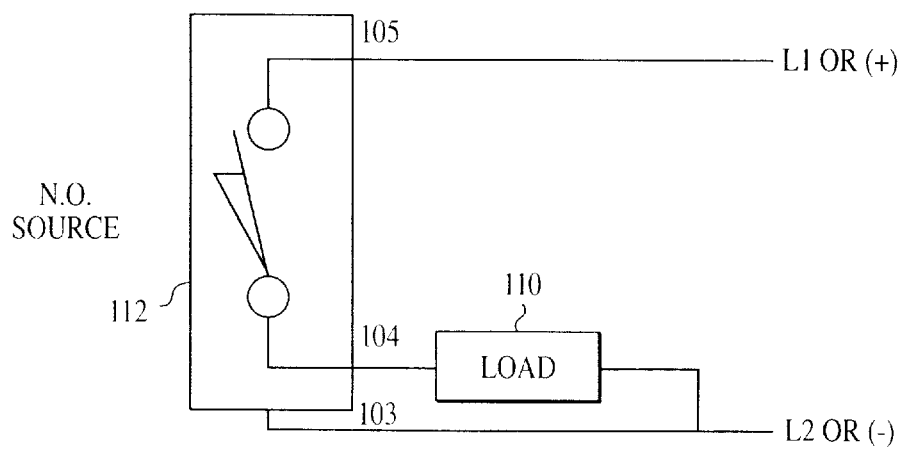
Figure 1D:
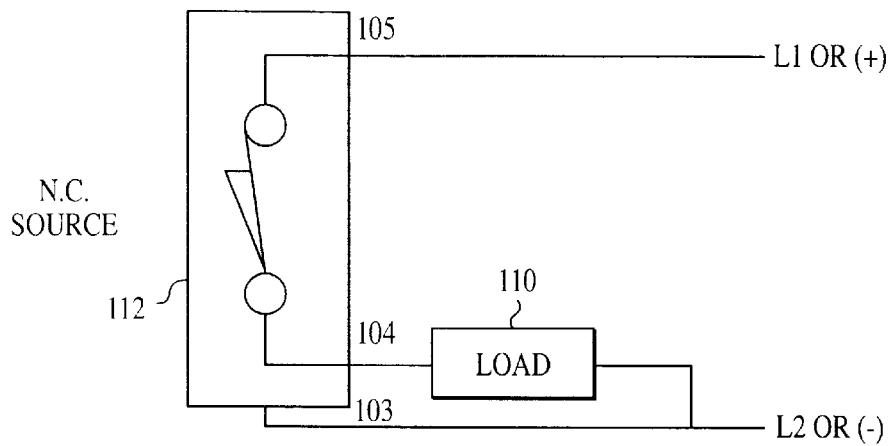
Figure 1E:
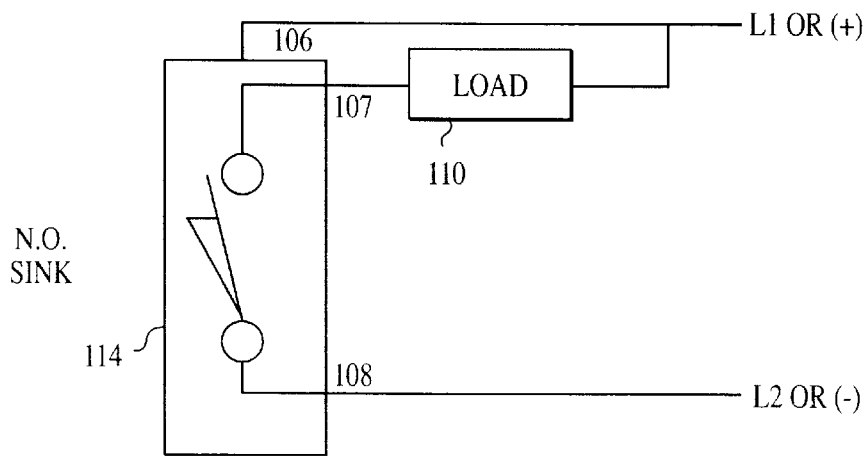
Figure 1F:
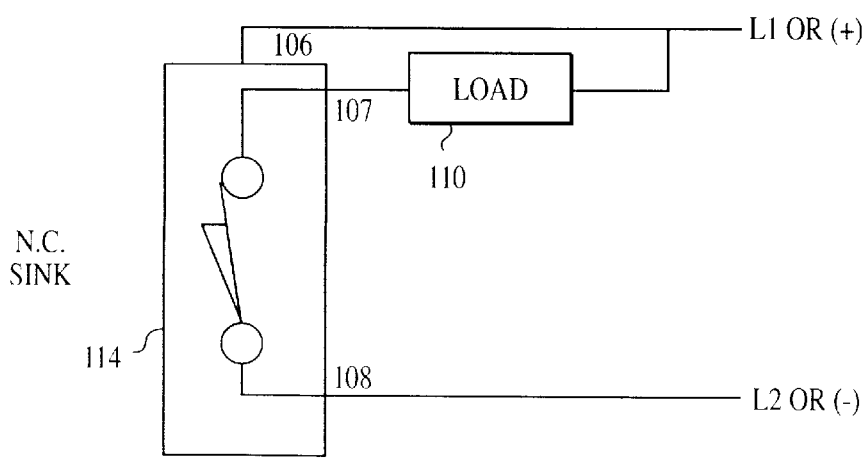
Figure 2:
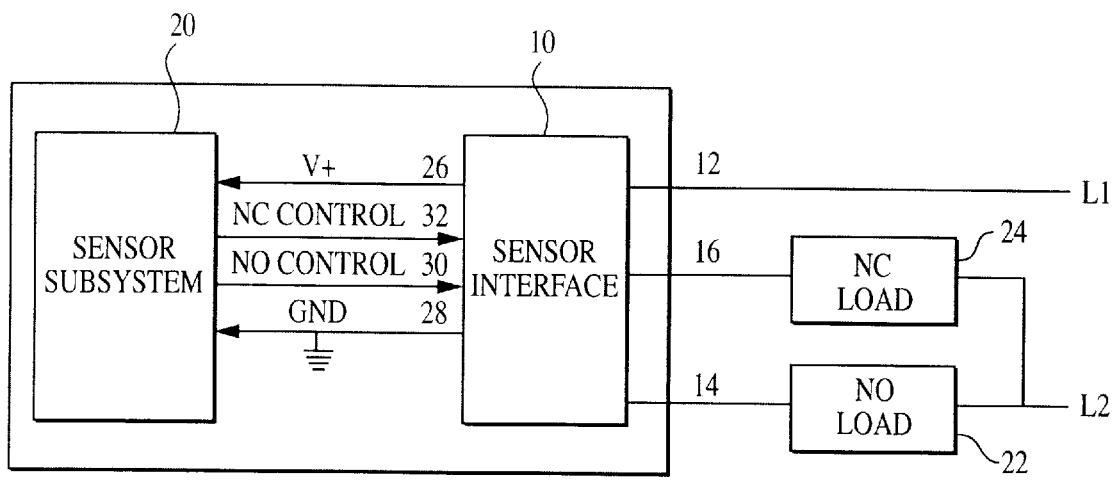
FIG. 2 is a block diagram illustrating a preferred sensor interface connected to a sensor subsystem and normally open and normally closed load devices.

FIG. 2 illustrates one embodiment of the three-wire sensor interface 10 configured in accordance with the present invention. The three-wire sensor interface 10 is preferably coupled to three external terminals (shown as ref. numerals 12, 14, and 16), and four interface terminals (shown as ref. numerals 26, 28, 30, and 32) connected to a sensor subsystem 20. One of the three external terminals coupled to the sensor interface 10, for example external power terminal 12, provides a power input for energizing the circuitry contained within the sensor interface 10 and the attached sensor subsystem 20. Preferably, the sensor interface 10 may operate on alternating current or either polarity direct current. Preferably, the supply power (not shown) can vary over a large range of values, for example, between 6 and 340 volts for a preferred proximity detector used as a component of the sensor subsystem 20. One preferred voltage regulator designed to operate with this wide range of input voltages is described below. The two remaining terminals, 14 and 16, provide a normally open control output (for example, at a normally open external terminal 14) and a normally closed control output (for example, at a normally closed external terminal 16). In operation, the normally open control output at terminal 14 is coupled to zero, one or more normally open load devices 22 and the normally closed control output at terminal 16 is coupled to zero, one or more normally closed load devices 24. The load devices may be, for example, starter relays connected to motors, solenoid actuators and programmable logic controllers (PLCs).

The sensor subsystem 20 may preferably include any conventional type of on/off control sensor, such as a movement sensor, a proximity detector, a Hall-effect switch, an ultrasonic level sensor, or any similar sensor operable to control a plurality of loads in accordance with predetermined criteria. A preferred proximity detector is disclosed in an application entitled "Proximity Detector for Hard-to-Detect Materials," filed on Jun. 23, 1999, and assigned to the assignee of the present invention, the contents of which are incorporated herein in its entirety for all purposes. The sensor subsystem 20 and the sensor interface 10 may be packaged together in a common circuit board assembly.

Power is coupled to the sensor subsystem 20 from the sensor interface 10 through power conductor 26 and a ground connection is attached to the sensor subsystem 20 through ground connector 28. The sensor subsystem 20 performs appropriate sensing operations, such as, for example, detecting the presence of certain materials or detecting the level of material or fluid in a holding container, and outputs one or more control signals, e.g., a normally open control output signal 30 and a normally closed control output signal 32—to the sensor interface 10. Importantly, the sensor subsystem 20 must be designed such that only one of the control signals, either the normally open control output signal 30 or the normally closed control output signal 32, is active at any given point in time.

In an alternative embodiment, only one control output signal (either normally open or normally closed) is provided by the sensor subsystem 20 and the opposite control output signal is derived by the logical negation of the available control output signal. For example, if the available control output signal is the normally open control output signal, the normally closed control output signal is derived from the normally open control output signal by negating the normally open control output signal (i.e., if normally open control output signal is active, normally closed control output signal is inactive). In such an embodiment, the sensor interface 10 may only require one interface terminal to connect to the only one control output signal from the sensor subsystem 20.

Figure 3:
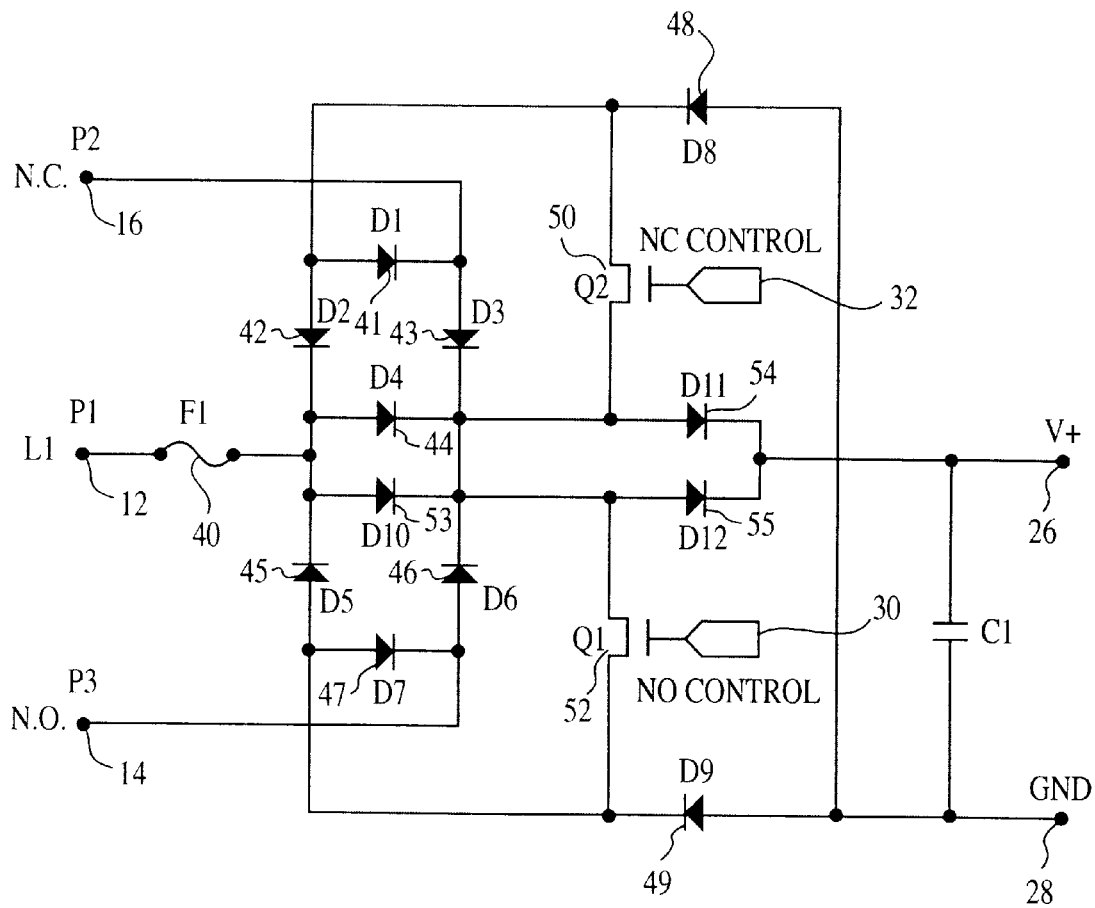
FIG. 3 is a circuit level diagram of a preferred sensor interface circuit for coupling the control outputs of the sensor subsystem to the load devices.

FIG. 3 illustrates an embodiment of the circuitry contained within the sensor interface 10. Supply power is coupled to the circuitry via external power terminal 12 and the current flows through fuse 40. The fuse 40 is preferably 125% of rated current. While the preferred sensor interface 10 may be used in various configurations, for ease of explanation, initially disclosed is a configuration wherein the sensor interface is adapted to control only one type of load device—either a normally open or a normally closed load device. Thus, the three-wire sensor interface 10 may be configured in a manner similar to conventional two-wire interface units and provide either a normally open or a normally closed control output, but not both. For example, when only one load device is present, for example, the normally closed load device 24, the normally closed control path extends from external power terminal 12 to external normally closed terminal 16 and includes fuse 40, the diode bridge formed by four unidirectional diodes 41, 42, 43, and 44, and a transistor 50. Preferably, the diodes may be 1N4004 having a peak inverse voltage above the worst case voltage anticipated (340V), for example at 400V. Preferably, the transistor 50 may be an enhancement mode n-channel MOSFET (e.g., MTP10N40E Mot., or an MTP2N60E Mot.).

Assuming an alternating current power supply is used, at which power terminal 12 is at a higher voltage than normally closed terminal 16 during the positive half-cycle, the current flows along the path formed by power terminal 12, fuse 40, diode 44, transistor 50, diode 41, and on to the normally closed terminal 16. For the negative half cycle, during which the power terminal 12 is at a lower voltage that the normally closed terminal 16, the current flows along the path formed by normally closed terminal 16, diode 43, transistor 50, diode 42, fuse 40 and power terminal 12. If the sensor interface 10 is coupled to a direct current power supply, the current flow path will follow one of the two above-described flow paths. For example, when using a positive voltage supply, the current flow path will follow the positive half-cycle flow. During both half cycles for an alternating current power supply (and for a direct current power supply) the current path through the transistor 50 is always from its drain terminal to its source terminal. Power is supplied to the sensor subsystem 20 via diode 54 and power conductor 26 by regulating the gate voltage on the transistor 50 in the normally closed path to ensure that the voltage differential between power conductor 26 and the ground conductor 28 is greater than the minimum voltage required to power the sensor subsystem 20. When the sensor subsystem 20 commands the normally closed control output signal 32 active (commanding the normally closed terminal 16 to open), the sensor interface 10 and the sensor subsystem 20 are powered by leakage current through the normally closed load device, i.e., current flowing through the load device that is insufficient to turn the device on. Thus, the transistor 50 in the normally closed path is off and the current flows from the power terminal 12 through the fuse 40, through the diode bridge (41–44), through diode 54, through the power conductor 26, the sensor subsystem 20, the ground conductor 28 and through diode 48. In this case, the voltage difference between the power conductor 26 and the ground conductor 28 is equal to the voltage used to supply the normally closed load 24 (when the load is powered). Thus, for a 240 VAC normally closed load 24, the peak voltage is approximately 340 volts.

In the event that only a normally open load device 22 is connected to the sensor interface 10 (i.e., the normally closed load device 24 is not present), the current flow paths may be similarly described. When the sensor subsystem 20 commands the normally open control output signal 30 active, the normally open flow path is between power terminal 12 and the normally open terminal 14 and includes the fuse 40, a diode bridge formed by four diodes 53, 45, 46, and 47, and transistor 52. Assuming an alternating current power source is coupled to the power terminal 12, during the positive half-cycle the current flows from the power terminal 12, through the fuse 40, through the diode 53, through the transistor 52, through the diode 47 and out through the normally open terminal 14. During the negative half-cycle, the current flows from normally open terminal 14, through the diode 46, through the transistor 52, through diode 45, through the fuse 40 and out through the power terminal 12. Again, if the sensor interface 10 is coupled to a direct current power supply, the current flow path will follow one of the two above-described flow paths. During both half cycles for an alternating current power supply (and for a direct current power supply) the current path through the transistor 52 is always from its drain terminal to its source terminal.

Alternatively, the sensor subsystem 20 may command the normally open control output signal 30 to be inactive. In this configuration (i.e., the normally open load device 22 present, with the normally closed load device 24 not present), the sensor interface 10 and the sensor subsystem 20 are powered by leakage current through the normally open load device 22. Thus, the transistor 52 is off and the current flows from the power terminal 12 through the fuse 40, through the diode bridge (53, 45–47), through diode 55 through the conductor 26, the sensor subsystem 20, the ground conductor 28 and through diode 49. In this case, the voltage difference between the power conductor 26 and the ground conductor 28 is equal to the voltage used to supply the normally open load device 22 (when the load is powered). Thus, for a 240 VAC normally open load 22, the peak voltage is approximately 340 volts. When the sensor subsystem 20 commands the normally open control output signal 30 active (commanding the normally open terminal 14 to close), power is supplied to the sensor subsystem 20 via diode 55 and power conductor 26 by regulating the gate voltage on the transistor 52 to ensure that the voltage differential between conductor 26 and the ground conductor 28 is greater than the minimum voltage required to power the sensor subsystem 20.

While the above description of FIG. 3 assumes that only one load is present (either the normally open load device 22 or the normally closed load device 24), the present invention may be operated with both types of device loads present. In the default state, in which the normally open control signal 30 from the sensor subsystem 20 is commanded open, and the normally closed control signal 32 from the sensor subsystem 20 is commanded closed, the transistor 50 in the normally closed flow path is on and the transistor 52 is off. In this case, the voltage at the source of the transistor 52 is at a lower potential than the voltage at the source of the transistor 50. The current flows from the power terminal 12, through the fuse 40, into the diode bridge though diodes 53 and 45–47, through diode 55, through the power conductor 26 into the sensor subsystem 20, out though the ground conductor 28, through the diode 49 and through the normally open terminal 14. In this configuration, the diode 48 in the normally closed loop is preferably reversed biased, thus reducing the possibility that the current which flows through the transistor 50 in the normally closed path will inadvertently power the normally open load device 22.

As the sensor subsystem 20 commands the system into an energized state, by, for example, commanding the normally closed signal 32 to open and the normally open control signal 30 to closed, the transistor 52 is on and the transistor 50 is off. In this case, the voltage at the source of the transistor 50 is at a lower potential than the voltage at the source of the transistor 52. The current flows from the power terminal 12, through the fuse 40, into the diode bridge though diodes 41–44, through diode 54, through the power conductor 26 into the sensor assembly 20, out though the ground conductor 28, through the diode 48 and through the normally closed terminal 16. In this configuration, the diode 49 in the normally open loop is preferably reversed biased, thus reducing the possibility that the current which flows through the transistor 52 will inadvertently power the normally closed load device 24.

In each of these configurations (i.e., when the sensor subsystem 20 is either commanding the normally open control signal 30 or the normally closed control signal 32 to active), the power supplied to the sensor subsystem 20 through the power conductor 26 is supplied by the leakage current associated with the load that is turned off.

Figure 4:
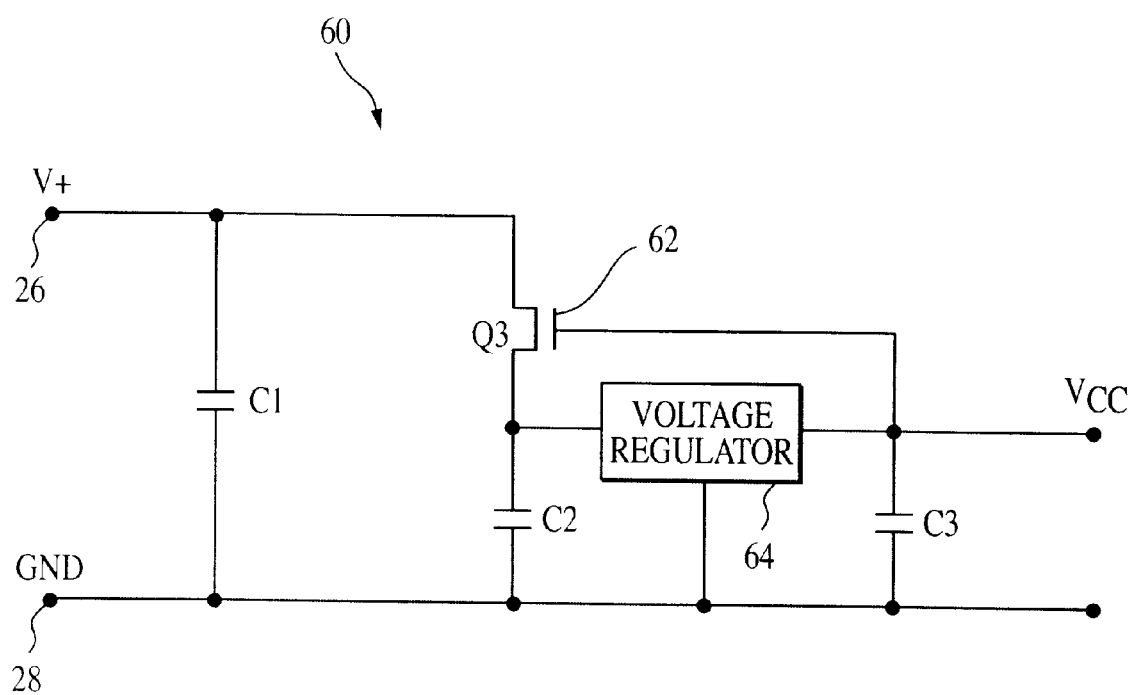
FIG. 4 is a circuit level diagram of a preferred voltage regulator for use in the present invention.

FIG. 4 illustrates an embodiment of a closed loop high voltage linear regulator circuit 60 preferably included within the sensor subsystem 20 and designed to handle a wide range of input voltages for generating a regulated supply voltage. This design is described in application note AN-D17, "High Voltage Off-Line Linear Regulator," by Jimes Lei, Supertex, Inc., the contents of which are incorporated herein in its entirety for all purposes. The regulator circuit 60 preferably includes an integrated circuit linear regulator 64, such as, for example, Ricoh part no. RH5RA50AA, which is a 5.0V regulator. The regulator circuit 60 also preferably includes a transistor 62, such as an N-channel depletion mode device with a threshold voltage less than the dropout voltage associated with the integrated circuit regulator 64 and a breakdown voltage greater than the maximum value of the voltage present at power terminal 12. Preferably, the transistor 62 is connected in a source-follower configuration, wherein its gate is connected to the output, $V_{cc}$, and to ground through capacitor C3, its source terminal is connected to the input of the integrated circuit regulator 64 and to ground potential through capacitor C2, and its drain terminal is connected to V+ (power conductor 26). Preferably, all of the capacitors, C1, C2, and C3, are bypass capacitors. Power from an external power source is applied to V+ and as V+ increases, $V_{cc}$ will also increase until $V_{cc}$ reaches its regulated voltage as controlled by the linear regulator 64, for example 5.0 V.

Although the present invention has been described in considerable detail with reference to certain presently preferred embodiments thereof, other embodiments are possible without departing from the spirit and scope of the present invention. Therefore the appended claims should not be limited to the description of the preferred versions contained herein.

We claim:

1. A three-wire sensor interface capable of being coupled to a sensor subsystem for conducting signals to and from the sensor subsystem, wherein the sensor subsystem provides one or more control signals, the sensor interface providing interfaces for concurrently controlling the operation of normally open and normally closed load devices and comprising:

three terminals consisting of:
a normally open external terminal capable of electrically connecting to one or more normally open load devices to control the operation of the one or more normally open load devices;
a normally closed external terminal capable of electrically connecting to one or more normally closed load devices to control the operation of the one or more normally closed load devices; and
only one external power terminal for connection to a source of electrical power having current to supply power to the sensor interface, wherein current from the supply power flows along a path that includes the external power terminal, the sensor interface, the sensor subsystem, and one of either the normally open or closed external terminals;
one or more interface terminals electrically coupled to the sensor subsystem; and
an interface circuit that receives the one or more control signals from the sensor subsystem through the one or more interface terminals and couples the control signals to the appropriate normally open or normally closed external terminals.

2. The sensor interface of claim 1 wherein the sensor subsystem provides either a normally open or a normally closed control signal and wherein the sensor interface derives the unprovided normally open or normally closed control signal based on the provided control signal.

3. The sensor interface of claim 1 wherein the control signals comprise a normally open and a normally closed control signal, and wherein the one or more interface terminals comprise a normally open control terminal and a normally closed control terminal, and wherein the interface circuit receives the normally open and normally closed control signals from the sensor subsystem through the normally open and normally closed control terminals.

4. The sensor interface of claim 3 wherein the one or more interface terminals further comprise an interface power terminal and the external power terminal further supplies power to the sensor subsystem through the interface power terminal.

5. The sensor interface of claim 4 wherein the interface circuit comprises a circuit to couple the control signals to the appropriate normally open or normally closed external terminals comprising:

a normally open control path adapted to receive the normally open control signal from the sensor subsystem, to receive supply power through the external power terminal from an external power supply, to couple the normally open control signal to the normally open external terminal, and to couple the supply power to the interface power terminal through the normally open control path when the normally open control signal is inactive; and a normally closed control path adapted to receive the normally closed control signal from the sensor subsystem, to receive supply power through the external power terminal from an external power supply, to couple the normally closed control signal to the normally closed external terminal, and to couple the supply power to the interface power terminal through the normally closed control path when the normally closed control signal is inactive.

6. The sensor interface of claim 4 wherein the interface circuit comprises a circuit to couple the control signals to the appropriate normally open or normally closed external terminals comprising:

a normally open control path adapted to receive the normally open control signal from the sensor subsystem, to receive supply power through the external power terminal from an external power supply, to couple the normally open control signal to the normally open external terminal, and to couple the supply power to the interface power terminal through the normally open control path when only one or more normally open load devices are connected to the sensor interface; and a normally closed control path adapted to receive the normally closed control signal from the sensor subsystem, to receive supply power through the external power terminal from an external power supply, to couple the normally closed control signal to the normally closed external terminal, and to couple the supply power to the interface power terminal through the normally closed control path when only one or more normally closed load devices are connected to the sensor interface.

7. The sensor interface of claim 1 wherein the sensor subsystem is powered by leakage current through the normally open load device when the normally open control signal is inactive.

8. The sensor interface of claim 1 wherein the sensor subsystem is powered by leakage current through the normally closed load device when the normally closed control signal is inactive.

9. The sensor interface of claim 1 wherein the sensor subsystem further comprises a high voltage linear regulator circuit that generates a regulated supply voltage that is coupled to the external power terminal.

10. The sensor interface of claim 9 wherein the regulator circuit is a closed-loop voltage regulator for generating the regulated supply voltage.

11. The sensor interface of claim 1 wherein the sensor subsystem and the sensor interface are packaged together in a common circuit board assembly.

12. The sensor interface of claim 1 wherein the sensor subsystem is a proximity detector.

13. A sensor adapted to control normally open and normally closed load devices comprising:
  a sensor subsystem that detects the presence or level of material and provides one or more control signals in response to the detection of material;
  a three-wire sensor interface electrically coupled to the sensor subsystem, the sensor interface providing interfaces for concurrently controlling the operation of the normally open and normally closed load devices and comprising:
   (i) three external terminals consisting of:
     a normally open external terminal capable of electrically connecting to one or more normally open load devices to control the operation of the one or more normally open load devices;
     a normally closed external terminal capable of electrically connecting to one or more normally closed load devices to control the operation of the one or more normally closed load devices; and
     only one external power terminal for connection to a source of electrical power having current to supply power to the sensor interface, wherein current from the supply power flows along a path that includes the external power terminal, the sensor interface, the sensor subsystem, and one of either the normally open or closed external terminals;
   (ii) one or more interface terminals electrically coupled to the sensor subsystem; and
   (iii) an interface circuit adapted to receive the one or more control signals from the sensor subsystem through the one or more interface terminals and to couple the control signals to the appropriate normally open or normally closed external terminals.

14. The sensor interface of claim 13 wherein the sensor subsystem provides either a normally open or a normally closed control signal and wherein the sensor interface derives the unprovided normally open or normally closed control signal based on the provided control signal.

15. The sensor interface of claim 13 wherein the control signals comprise a normally open and a normally closed control signal, and wherein the one or more interface terminals comprise a normally open control terminal and a normally closed control terminal, and wherein the interface circuit receives the normally open and normally closed control signals from the sensor subsystem through the normally open and normally closed control terminals.

16. The sensor interface of claim 15 wherein the one or more interface terminals further comprise an interface power terminal and the external power terminal further supplies power to the sensor subsystem through the interface power terminal.

17. The sensor interface of claim 16 wherein the interface circuit comprises a circuit to couple the control signals to the appropriate normally open or normally closed external terminals comprising:
  a normally open control path adapted to receive the normally open control signal from the sensor subsystem, to receive supply power through the external power terminal from an external power supply, to couple the normally open control signal to the normally open external terminal, and to couple the supply power to the interface power terminal through the normally open control path when the normally open control signal is inactive; and
  a normally closed control path adapted to receive the normally closed control signal from the sensor subsystem, to receive supply power through the external power terminal from an external power supply, to couple the normally closed control signal to the normally closed external terminal, and to couple the supply power to the interface power terminal through the normally closed control path when the normally closed control signal is inactive.

18. The sensor interface of claim 16 wherein the interface circuit comprises a circuit to couple the control signals to the appropriate normally open or normally closed external terminals comprising:
  a normally open control path adapted to receive the normally open control signal from the sensor subsystem, to receive supply power through the external power terminal from an external power supply, to couple the normally open control signal to the normally open external terminal, and to couple the supply power to the interface power terminal through the normally open control path when only one or more normally open load devices are connected to the sensor interface; and
  a normally closed control path adapted to receive the normally closed control signal from the sensor subsystem, to receive supply power through the external power terminal from an external power supply, to couple the normally closed control signal to the normally closed external terminal, and to couple the supply power to the interface power terminal through the normally closed control path when only one or more normally closed load devices are connected to the sensor interface.

19. The sensor interface of claim 13 wherein the sensor subsystem is powered by leakage current through the normally open load device when the normally open control signal is inactive.

20. The sensor interface of claim 13 wherein the sensor subsystem is powered by leakage current through the normally closed load device when the normally closed control signal is inactive.

21. The sensor interface of claim 13 wherein the sensor subsystem further comprises a high voltage linear regulator circuit that generates a regulated supply voltage that is coupled to the external power terminal.

22. The sensor interface of claim 21 wherein the regulator circuit is a closed-loop voltage regulator for generating the regulated supply voltage.

23. The sensor interface of claim 13 wherein the sensor subsystem and the sensor interface are packaged together in a common circuit board assembly.

24. The sensor interface of claim 13 wherein the sensor subsystem is a proximity detector.

* * * * *